United States Patent [19]

Lahita

[11] Patent Number: 4,817,337
[45] Date of Patent: Apr. 4, 1989

[54] RADIATION RESISTANT DOOR SEAL

[75] Inventor: Michael J. Lahita, Tulsa, Okla.

[73] Assignee: AMCA International Corp., Hanover, N.H.

[21] Appl. No.: 93,756

[22] Filed: Sep. 8, 1987

[51] Int. Cl.$^4$ ................................................ E06B 7/16
[52] U.S. Cl. ........................................ 49/483; 49/484; 174/35 MS
[58] Field of Search ............... 49/483, 484, 475, 488, 49/489; 174/35 MS, 35 L

[56] References Cited

U.S. PATENT DOCUMENTS

| | | | |
|---|---|---|---|
| 2,757,225 | 7/1956 | Dunn | 49/484 X |
| 3,055,969 | 9/1962 | Schaller, Jr. | 49/484 X |
| 3,296,356 | 1/1967 | McAdams | 49/483 X |
| 3,437,735 | 3/1969 | Schaller, Jr. | |
| 3,507,974 | 4/1970 | Clark et al. | 174/35 MS |
| 3,589,070 | 6/1971 | Hansen | 49/483 |
| 4,069,618 | 1/1978 | Geiss | 49/483 |
| 4,677,251 | 6/1987 | Merewether | 174/35 MS |
| 4,691,483 | 9/1987 | Anderson | 174/35 MS X |
| 4,705,916 | 11/1987 | Wadhera et al. | 174/35 MS X |
| 4,724,635 | 2/1988 | Side et al. | 174/35 MS X |

FOREIGN PATENT DOCUMENTS

909009 10/1962 United Kingdom .................. 49/483
968968 9/1964 United Kingdom .

*Primary Examiner*—Kenneth J. Dorner
*Assistant Examiner*—James R. Brittain
*Attorney, Agent, or Firm*—Harness, Dickey & Pierce

[57] ABSTRACT

An enclosure to be electromagnetically shielded includes first and second conductive joints, the first conductive joint comprising a channel including a pair of side walls and a back wall whereby to define a truncated wedge-shaped cross-section including an interior shoulder facing an enlarged chamber adjacent the back wall, a deformable body of polymer enclosed in a conductive mesh and abutting the back wall, and a nonplanar contact member engaging the mesh body, the back wall and each respective side wall at three points. The second conductive joint includes a flange plate to overlap the first joint and a blade to engage the contact members and the mesh body whereby to provide radiation shielding. A metallic gasket recessed in the flange is compressed between the conductive joints to resist passage of radiation, dust or moisture.

53 Claims, 2 Drawing Sheets

RADIATION RESISTANT DOOR SEAL

This invention relates to the construction of radiation shielded enclosures of the type designed to have an interior that may be relatively isolated from radio interference and other radiation. The invention is particularly directed to the construction of door joints for such enclosures for the purpose of increasing the resistance to radiation penetration through the joints between the edges of the door and its frame.

U.S. Pat. 3,589,070 issuing Apr. 3, 1970 to Hansen shows a plate extending from a door, a U-shaped channel in a frame sized to receive the plate member when the door is closed, and a pair of contact strips each engaging one side wall of the channel and making contact with one side of the plate member when the door is closed.

Shielding effectiveness requirements are ever increasing such that standards that were acceptable ten years ago may be totally unacceptable today. For example, the door joint must be as resistant to radiation leakage as the enclosure itself. Flat walls, such as shown in the Hansen channel, do not complement the spring fingers to increase the metal-to-metal surface area contacted and thus may not enhance shielding effectiveness.

A door and frame construction herein provides 360° environmental protection against air, sound and dust and radiation (non-ionizing) protection about the periphery of the door. Environmental gaskets protect the contact plates against oxidation when the door is closed (which could be most of the time) and increase shielding effectiveness. Tapering of channel side walls to complement the different contact sections increases surface contact, reduces friction, and improves radiation shielding by the metal-to-metal contacting between contact spring fingers. A knife-edge shoulder in each opposed channel side wall increases contact with its contact plate, forms part of an enlarged chamber, and cooperates to hold its contact plate in the channel. Further, tapered side walls reduce friction forces resisting door closure and increase conductive paths by affording a larger contacting surface of the contact plates with the blade.

The foregoing and other objects and advantages will become more apparent when viewed in light of the accompanying drawings and following detailed description in which:

Figure 1:
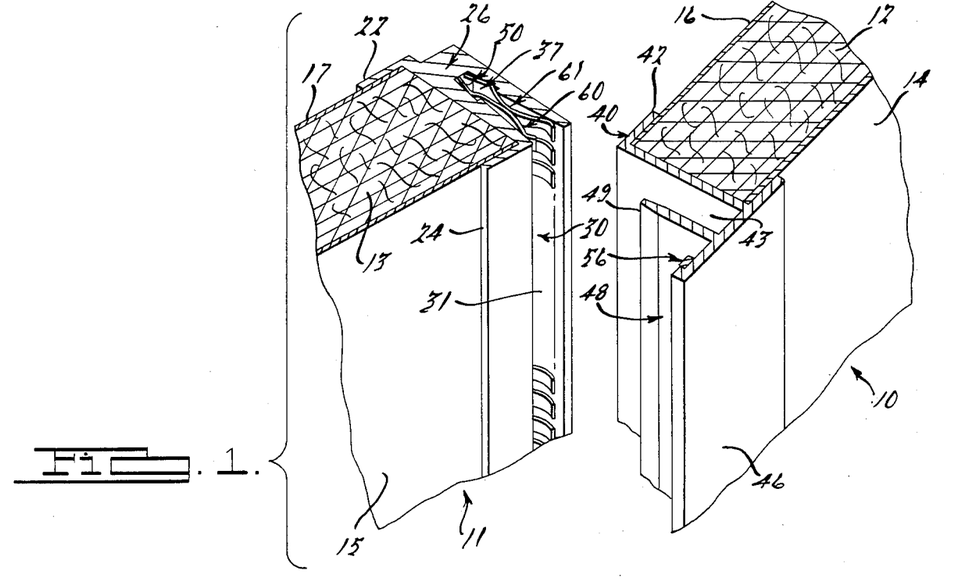
FIG. 1 is an isometric view of a portion of a door for a radiation resistant structure and a portion of the frame of the enclosure against which the front edge of the door closes, the door being shown in a slightly open position.
Figure 2:
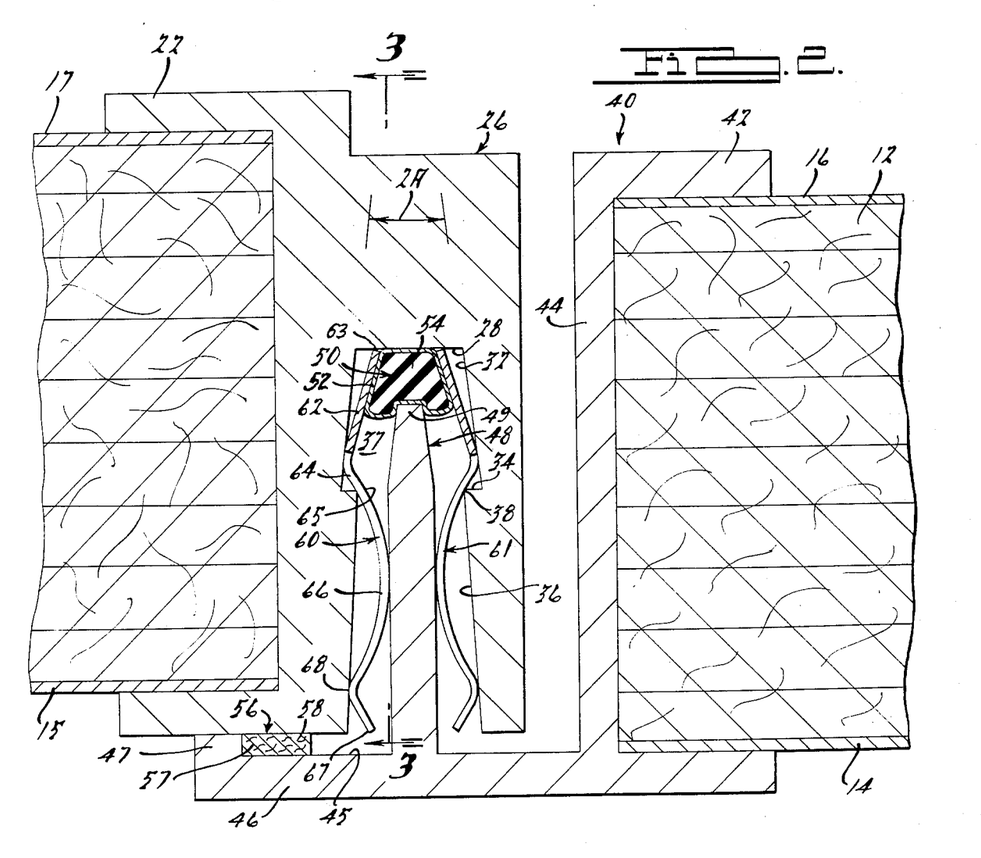
FIG. 2 is a horizontal section of the two edge portions of the door and frame with the door in fully closed position.
Figure 3:
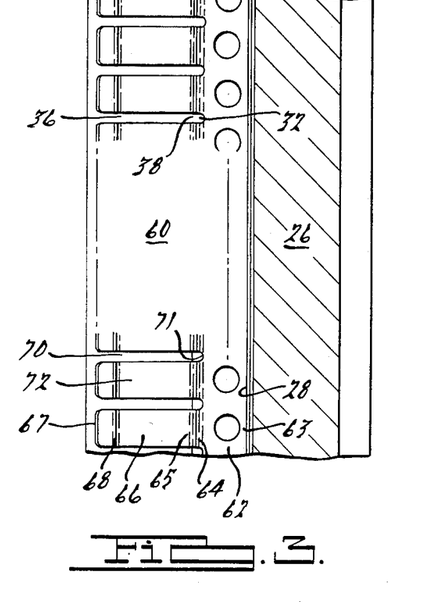
FIG. 3 is a vertical section taken on line 3—3 of FIG. 2.
Figure 4:
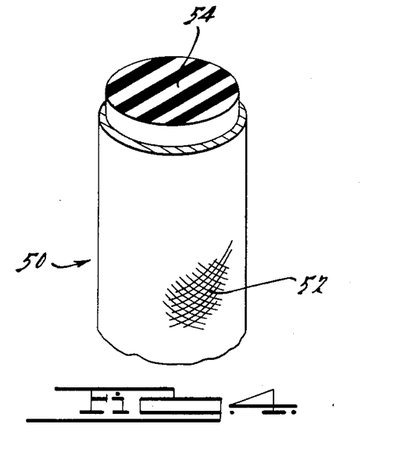
FIG. 4 a view Partially in section of a polymer gasket enclosed in a conductive mesh and in a relaxed state.
Figure 5:
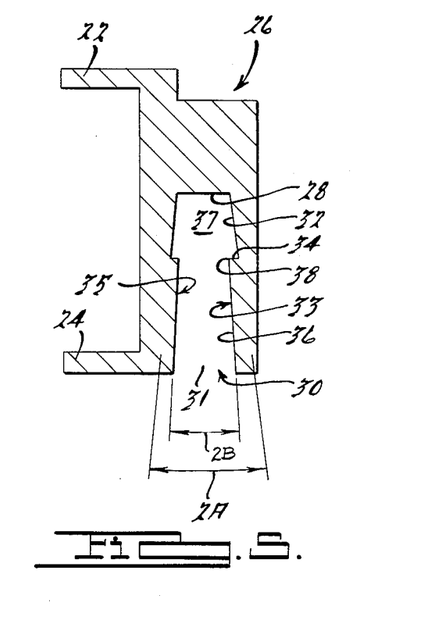
FIG. 5 is a section view of the conductive edge of the frame.
Figure 6:
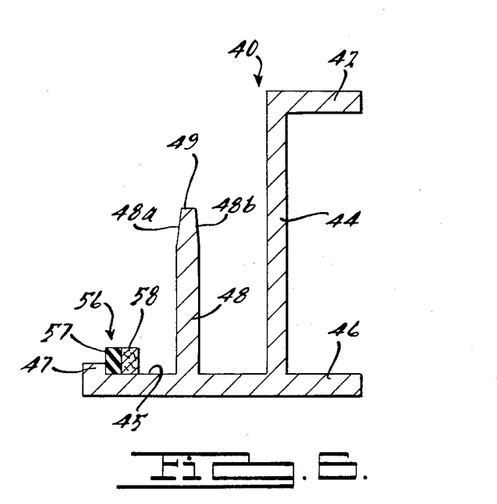
FIG. 6 is a section view of the conductive edge of the door showing a flange for compressing a conductive gasket against the frame.

Turning now to the drawings a door 10 is arranged to swing about hinges (not shown) located at the right of the portion of the door illustrated in FIG. 1. This door cooperates with a frame 11 which may be a portion of the wall of a radiation-proof enclosure to which the door is mounted. As shown in FIGS. 1 and 2 both door 10 and frame or wall 11 are composed of wood laminations 12 and 13 respectively and these are sheathed on their opposite sides or faces by metallic sheets 14, 16 and 15, 17. A conductive joint member 26 is mounted on the edge of door frame 11 and a cooperative conductive joint member 40 is mounted on the corresponding edge of door 10.

Joint member 26 has a pair of flanges 22, 24 which are mounted in fixed relation to door frame 11 and has a vertical channel 30 formed by side walls 33 and 35 which project forwardly from the bottom of the channel or back wall 28. A mouth or opening 31 of channel 30 facing the outside of the enclosure is disposed to the left of door 10 as shown in FIG. 1.

A pair of resilient contact members 60, 61 are disposed in the channel, each contact being made from beryllium copper and comprising an elongated comb-like strip of metal of generally uniform cross-section including opposite generally parallel edges 63, 67 one edge 63 engaging wall 28 and the other edge 67 adjacent opening 31 of the channel, a flat planar portion 62 extending from the edge 63, a bowed rearward section 64, a bowed central section 66, and a bowed forward section 68 adjacent the edge 67. A plurality of slots 70 extend inwardly from the other edge 67 to their terminus 71 in the planar portion 62 whereby to define a plurality of laterally separated fingers 72. As described herein, each contact member the channel at four points.

Cooperating joint member 40 of the radiation resistant joint is secured to door 10 and includes flanges, 42, 44, 46 and a rigid blade member 48 extending perpendicularly from flange 46. The blade member 48 is adapted to enter into the channel 30 and has slightly tapered leading edges 48a, 48b to enhance entry into the channel when engaging the opposed resilient contact xembers 60, 61 and an end 49 for engaging a deformable conductive gasket 50 abutting the back wall 28 of the channel 30.

The flange 46 has an inner face 45 adapted to confront the frame 11 and extend laterally beyond (i.e. overlap) the outer peripheral edges of the doorway in a covering relation about the channel opening 31. A lip 47 extends from the inner face 45 to define a marginal recess adjacent the lip around the flange edges.

A conductive/nonconductive gasket 56 is mounted in the recess to provide environmental sealing protection from moisture, dust and sound and sealing against electromagnetic radiation Preferably a nonconductive portion 57 is adjacent to the lip 47 to prevent moisture or dust from entering and a conductive portion 58 comprised of a metallic mesh is interiorly of the lip to resist entry or escape of electromagnetic radiation from the enclosure. Nonconductive portion 57 may be extruded or formed of materials such as closed cell rubber, felt, neoprene, open cell polyurethane foam or a polyvinyl chloride closed cell vinyl foam. The mesh 58 preferably comprises tin coated copper clad steel, tin plated phosphor bronze, silver plated brass, MONEL (an alloy) or aluminum. When the door is closed, the gasket 56 is compressed between the conductive joints 26, 40.

The deformable conductive gasket 50 mounted in the channel against the back wall 28 functions to reduce acoustic levels and provide electrical contact between the contact plates 62, the back wall 28 and the blade 48. Gasket 50 is elongated, generally cylindrical and comprised of a deformable polymer 54 enclosed by a conductive metal mesh 52. The materials could be as described above for gasket 56.

The side walls 33, 35 and tack wall 28 of the channel 30 describe a lengthwise extending truncated edge shaped cross-section including an enlarged chamber 37 adjacent to the back wall 28. Each side wall includes an end wall 34 defining a shoulder or knife edge 38 and first and second side wall portions 32, 36, the first side wall portion 32 defining part of the chamber 37 and extending outwardly from the back wall 28 of the channel 30 and to the wall 34, and the second side wall portion 36 extending inwardly from the mouth or opening 31 leading into the channel and to the shoulder 38. The end walls 34 face the back wall and extend between the first and second side wall portions whereby to cause the second side wall portions 36 to be laterally offset from and superposing the first side wall portions 32. The end walls 34, the first side wall portions 32, and the back wall 28 define the enlarged chamber 37. To advantageously cooperate with the contact members 60, 61, the side walls are inclined away from one another at an acute angle relative to a perpendicular drawn from the back wall. As shown, the two wide walls 33, 35 are symmetrically disposed to the perpendicular and the first side wall portions 32 define a double included angle "2A" of between 10 and 50 degrees. In one construction an acute angle "A" of about 16 degrees was found suitable. It is to be understood that each second side wall portion 36 could be at a double included angle "2B" that the same as or at a different angle than its first side wall portion 32.

The contact xembers 60, 61 are positioned in the channel 30 such that the rearward edge 63 of each contact conductively engages both the back wall 28 and the gasket 50 and each contact conductively engages its respective side wall 33, 35 at three points, namely, the bowed rearward section 64 engages the first side wall portion 32 and the shoulder or knife edge 38, and the bowed forward section 68 engages the second side wall portion 36. Once inserted in the channel 30 the contact xembers 60, 61 are held in place by the ridge formed by 34, 38 whereupon the gasket 50 is inserted to engage end wall 28 and both plates 62. The shoulder 38 on each side wall defines a fulcrum such that when the blade 48 engages the bowed central section 66, the bowed forward and rearward section 64, 68 of each plate is biased against its side wall portion 32, 36. The knife edge 38 provides a high unit loading contact against the plates 60, 61 at 65 to ensure that electrical conductivity is not compromised by oxides or grit that may form on the metal.

The planar portions 62, while shown at an acute angle to a perpendicular drawn from back wall 28, are generally pressed against their inner first side wall portions 32. Driving entry of the blade against the gasket ensures that the planar portions 62 engage the side wall portions 32 and the edge 63 is driven against the wall 28. Advantageously four points of contact are achieved between each plate and the channel. Due to the slope of the second side wall portion 36 adjacent the channel opening 31 being complementary to the bowed forward section 68 of the contacts, frictional forces resisting opening or closing of the door are reduced without sacrifice in desired wiping of the side wall thereby assuring that a good electrical path is established between the joints.

Figure 7:
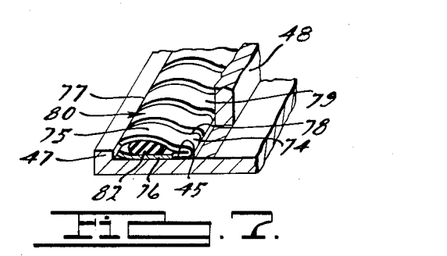
FIG. 7 is a section view of the door showing a conductive shielding member.

If a higher degree of shielding effectiveness were desired over that provided by environmental gasket 56, this gasket could be replaced with a slotted plate 80 sandwiching a deformable polymer 82 between plate portions 74, 76 such as shown in FIG. 7. The plate portions form a generally U-shaped cross-section and extend between lip 47 and blade 48 with the bottom plate portion 76 abutting inner face 45 and the top plate portion 74 including a raised portion 75 extending above lip 47 to be compressively engaged by the flange 24 when the door is closed. A plurality of slots 78 extend inwardly from one edge 77 of plate portion 74 to define a plurality of side-by-side fingers 79, the slots having their terminus in the bottom plate portion 76. It should be understood that the plate 80 could be reversed such that the edge 77 faces the blade 48. Further, the slots could terminate in the top plate portion 76 short of its opposite edge so as to position a continuous lengthwise extending metal portion adjacent the lip 47. The materials for each would be as described above.

Thus there is disclosed in the above-description and in the drawings an embodiment of the invention which fully and effectively accomplishes the objects thereof. However, it will be apparent that variations in the details of the apparatus may be indulged in without departing from the sphere of the invention herein described, or the scope of the appended claims.

What is claimed is:

1. In a radiation resistant enclosure comprising a door member hingedly fixed to a frame member having a doorway adjacent edge portions of the members being electrically conductive, one member including a conductive channel extending lengthwise and having a back wall and a pair of side walls and the other member including a conductive blade extending lengthwise and insertable within said channel, and a pair of elongated metal plates for engaging one respective side wall in said channel and the blade to establish good electrical contact therebetween, characterized in that said side walls incline outwardly from the and away from one another whereby to describe a truncated edge-shaped cross-section including an interior shoulder and an enlarged interior chamber adjacent the back wall, and each plate has opposite edges with one said edge conductively connected to the back wall, a planar portion extending from the one edge, a bowed rearward section extending from the planar portion and engaging the side wall of said chamber and the shoulder, a bowed forward section extending from the other edge and engaging the side wall adjacent to the opening to said channel, and a bowed central section connecting said sections and adapted to engage the blade.

2. The radiation resistant enclosure as recited in claim 1 wherein each side wall includes an inner and an outer portion, the respective portions being parallel and laterally offset from one another by its shoulder and said inner portion extending between its shoulder and the back wall.

3. The radiation resistant enclosure as recited in claim 2 wherein each said bowed forward section slidingly contacts the respective second portion of its side wall and each said bowed rearward section is biased against the respective first portion of its side wall.

4. The radiation resistant enclosure as recited in claim 1 further characterized by conductive first shield means in said channel engaging the back wall and the planar portion of said plates for electromagnetically shielding the enclosure, said first shield means being engaged by the blade for conductively interconnecting the back wall and the metal plates with the blade when the door is closed.

5. The radiation resistant enclosure as recited in claim 4 wherein said first shield means comprises a metallic mesh surrounding a deformable body.

6. The radiation resistant enclosure as recited in claim 4 wherein each said planar portion is generally compressed into engagement with its respective side wall adjacent to the back wall.

7. The radiation resistant enclosure as recited in claim 6 wherein the towed central sections engage one another when the blade is not in the channel and each shoulder engages its plate and functions as a fulcrum when the central section engages the blade to bias the rearward and forward sections of its plate, respectively, against the chamber wall and the outer portion.

8. The radiation resistant enclosure as recited in claim 1 wherein a plurality of laterally separated slots extend inwardly from the other edge of each said plate whereby to define a plurality of resilient fingers, each slot having an inward terminus adjacent to the one edge.

9. The radiation resistant enclosure as recited in claim 1 wherein said side walls describe a double included angle of between 10° and 50°.

10. The radiation resistant enclosure as recited in claim 1 wherein each side wall is at an acute angle to a perpendicular drawn to the tack wall, said acute angle being approximately 16°.

11. The radiation resistant enclosure as recited in claim 1 wherein said channel forms a continuous 360° opening to receive a like extending blade.

12. The radiation resistant enclosure as recited in claim 1 characterized by conductive second shield means exterior of the channel for shielding 360° around the door and the frame when the door is closed.

13. The radiation resistant enclosure as recited in claim 12 wherein said door includes a planar metallic flange disposed in overlapping relation around the conductive perimeter of the doorway when the door is closed, and said second shield means comprises a deformable conductive gasket compressed between the flange and the frame for shielding the door and the enclosure by completing a continuous conductive path therebetween to resist radiation from entering through the doorway.

14. The radiation resistant enclosure as recited in claim 13 wherein said second conductive gasket includes moisture sealing means for shielding the enclosure from moisture or dust.

15. The radiation resistant enclosure as recited in claim 14 wherein said flange has a marginal recess inwardly of its periphery, and said conductive gasket comprises an elongated two-part strip mounted in said recess one Part being conductive mesh and the other part being a deformable polymer.

16. A radiation resistant joint between adjacent conductive edges of a stationary frame member defining an opening and a movable closure member adapted to close the opening, one said member including a blade extending therefrom for insertion into a conductive channel extending into the other member, said channel including a pair of side walls extending inwardly to an interior end wall, and electrical contact means in said channel for completing a conductive path between said blade and said channel whereby to form a conductive seal between the edges of said members to resist the transfer of radiation therebetween, characterized by said walls cooperating to describe a truncated wedge-shaped cross-section having an enlarged chamber adjacent to the end wall, said contact means completing at least three points of contact with each sidewall as well as contacting each side of said blade, a flange plate extending from the other member and in a plane perpendicular to the blade to overlap the opening formed in the stationary frame member, and sealing means including conductive metal compressed between the flange plate and the stationary member for sealing the peripheral edges of the opening from moisture and electromagnetic radiation, said sealing means comprising a metal plate formed into a U-shaped cross-section to define a pair of plate portions one plate portion engaging the flange plate and the other plate portion including a raised portion compressed by the frame member, and a strip of polymer sandwiched between the plate portions.

17. The radiation resistant joint as recited in claim 16 wherein said contact means engage said interior end wall whereby to complete four points of contact with the channel.

18. The radiation resistant joint as recited in claim 17 wherein said side walls incline away from each other relative to a perpendicular extending outwardly from the end wall.

19. The radiation resistant joint as recited in claim 16 wherein the first portions of said walls and said first sections of said plates are generally flat.

20. The radiation resistant joint as recited in claim 19 wherein each plate includes laterally separated slots to describe a plurality of spring fingers.

21. The radiation resistant joint as recited in claim 16 characterized by conductive shield means electrically interconnecting said contact means, the end wall and the blade for completing a shielded engagement therebetween.

22. The radiation resistant joint as recited in claim 21 wherein said shield means comprises a conductive mesh disposed around a deformable polymer.

23. The radiation resistant joint as recited in claim 22 wherein the conductive mesh is a metal comprising a tin coated copper clad steel and the polymer is neoprene.

24. The radiation resistant joint as recited in claim 22 wherein the conductive mesh is a metal selected from the group consisting essentially of tin coated copper clad steel, tin plated phosphor bronze, silver plated brass, or aluminum.

25. In a doorway construction for a radio-frequency resistant enclosure of the type including a door frame defining a doorway, a door pivotally supported on said door frame and sized to close said doorway, each said door and door frame having conductive edge portions and one having a channel cooperating to receive a conductive blade from the other one when the door is closed, and contact means in said channel for completing a conductive path between the edge portions and said blade, characterized in that said channel includes a pair of stepped side walls and an end wall whereby to define an enlarged chamber interiorly of the channel the end wall, each side wall including a first, second and third portion, the third portions facing the end wall and joining the first and second portions whereby to define a shoulder, and said contact means comprise a pair of contact members that extend the length of the channel for electrically interconnecting with each portion of the side walls, the nd wall and the opposite sides of said blade when the blade is inserted therein, each contact member having a pair of bowed sections ne and the other, respectively, engaging the first portion and a second portion of one said side wall.

26. The doorway construction as recited in claim 25 wherein said de wall incline away from one another at an acute angle to a perpendicular to the end wall.

27. The doorway construction as recited in claim 26 wherein the first portions extend at an acute angle to a perpendicular from he end wall and away from one another.

28. The doorway construction as recited in claim 27 wherein the portions of each said side wall are not parallel to one another.

29. The doorway construction as recited in claim 27 wherein each said contact member is adapted to complement and make wiping engagement with the second portion when the blade is inserted into the channel.

30. In a closure for use in forming a radiation resistant joint between the conductive edges of a door and its frame, the closure for one edge of the door and the corresponding edge of the frame, first and second members one fixed to the door and the other fixed to the frame edge, said first member having a lengthwise channel with an interior end wall and opposing side walls, said channel being transverse to the plane of the door in the closed position, opposed resilient comb-like contact members one member disposed against each respective side wall throughout the length of the channel with each contact having one edge engaging the end wall, a bowed central section and a bowed forward section engaging its side wall, and said second member having mounted thereon a blade extending along the closure edges of the door and frame and insertable within said channel for engaging the centrally bowed portions so as to force them apart and make good electrical contact therewith, the improvement characterized in that the side walls of said channel are inclined at an acute angle with respect to each other and each have a shoulder defining first and second side wall portions to form an enlarged chamber adjacent the end wall, and each said contact member includes a flat portion and a bowed rearward section each disposed in the chamber, each said flat portion being generally complementary to and engaging its respective side wall in the chamber and the bowed rearward sections engaging its respective shoulder.

31. The closure as recited in claim 30 wherein said second member has mounted thereon a flange plate extending throughout the closure edge of the door and frame, said plate being parallel to the frame when closed and including a raised surface portion to define a recess, and conductive sealing means disposed in said recess for sealing the closure edge from radiation dust or moisture penetration.

32. The closure as recited in claim 31 wherein the joint extends along the top and bottom edges of the door and frame as well as to the rear edges of the door.

33. The closure as recited in claim 30 wherein said channel includes a seal comprised of conductive mesh for completing a conductive path between the blade, the contact xembers and the end wall.

34. In an enclosure of the type including a door member adapted to move into a closing relation about a doorway defined in a frame member to which the door is mounted, one said member including a channel having a pair of conductive metal plate members therein to be engage by a blade member inserted into the channel when the door is closed, said members being of a conductive material, the improvement comprising:

first sealing means axially compressible between the door and the frame for sealing the outer periphery of the doorway from electromagnetic radiation and moisture penetration, and second sealing means engaging the channel and said plate members and engageable by said blade member when inserted in a channel for conductively sealing the doorway from electromagnetic radiation, said channel being formed by opposing pairs of stepped side walls and defining a large chamber adjacent the interior end wall of the chamber, each plate member completing contact with each step forming its respective side wall.

35. The enclosure as recited in claim 34 wherein said channel includes side walls opposing one another and each engaged by one said plate member, the side walls having tapered first and second portions and defining an enlarged chamber adjacent the interior end wall of the channel, each plate member completing three points of contact with its respective side wall.

36. The enclosure as recited in claim 34 wherein said first sealing means comprises a lengthwise extending metal contact member comprising a first plate portion including a raised portion and opposite edges, closure of the door causing the raised portion to be compressively engaged by the frame.

37. The enclosure as recited in claim 36 wherein the contact member comprises a second plate portion connected to the first plate portion to form a U-shaped cross-section, and a plurality of slots extending inwardly from one edge to define a corresponding plurality of compressible fingers.

38. The enclosure as recited in claim 37 wherein said slots terminate on said second plate portion.

39. The enclosure as recited in claim 36 further comprising a polymer gasket being disposed between the plate portion and the door to be compressed by the frame.

40. A radiation resistant joint between adjacent conductive edges of a stationary frame member defining an opening and a movable closure member adapted to close the opening, one said member including a blade extending therefrom for insertion into a conductive channel extending into the other member, said channel including a pair of side walls extending inwardly to an interior end wall, and electrical contact means in said channel for completing a conductive path between said blade and said channel whereby to form a conductive seal between the edges of said members to resist the transfer of radiation therebetween, characterized by said walls cooperating to describe a truncated wedge-shaped cross-section having an enlarged chamber adjacent to the end wall with each said side wall including a first and a second portion and a shoulder forming a transition between its respective portions, said first portions extending from the end wall and including away from each other relative to a perpendicular extending outwardly from the end wall, and said electrical contact means comprising an elongated metal contact member disposed adjacent each side wall for completing at least three points of contact with its side wall as well as contacting each side of said blade, each contact member including a first section in said enlarged chamber adjacent the first portion of its side wall and engaging the end wall, a second section engaging the first portion of its side wall, a third section engaging its respective shoulder, a fourth section engaging one respective side of the blade, and a fifth section engaging the second portion of its side wall adjacent the channel opening.

41. A radiation resistant joint between adjacent conductive edges of a stationary frame member defining an opening and a movable closure member adapted to close the opening, one said member including a blade extending therefrom for insertion into a conductive channel extending into the other member, said channel including a pair of side walls extending inwardly to an interior end wall, and electrical contact means in said channel for completing a conductive path between said blade and said channel whereby to form a conductive seal between the edges of said members to resist the transfer of radiation therebetween, characterized by said side walls being laterally spaced with each having a shoulder defining first and second portions, both first portions being proximate the frame to define a throat to receive the blade and both second portions being proximate the end wall to form an interior chamber adjacent thereto, and said contact means contacting each side of said blade as well as contacting the first and second portions of each side wall.

42. The radiation resistant joint as recited in claim 41 wherein said contact means comprises a pair of contact plates each adapted to contact one respective side wall and receive the blade therebetween, a respective first, second and third section of each plate being adapted to, engage, respectively, the first portion, section portion and shoulder of its associated side wall.

43. The radiation resistant joint as recited in claim 42 wherein each plate is longitudinally extending and includes laterally slots to describe a plurality of spring fingers.

44. The radiation resistant joint as recited in claim 41 characterized by conductive shield means electrically interconnecting and completing a shielded engagement between said contact means, the end wall and the blade.

45. The radiation resistant joint as recited in claim 44 wherein said shield means comprises a conductive mesh disposed around a deformable polymer.

46. The radiation resistant joint as recited in claim 45 wherein the conductive mesh is a metal comprising a tin coated copper clad steel and the polymer in neoprene.

47. The radiation resistant joint as recited in claim 45 wherein the conductive mesh is a metal selected from th®group consisting essentially of tin coated copper clad steel, tin plated phosphor bronze, silver plated brass or aluminum.

48. The radiation resistant joint as recited in claim 41 characterized by a flange plate extending from the other member and in a plane perpendicular to the blade to overlap the opening, and sealing means including conductive metal compressed between the flange plate and the frame member for sealing the peripheral edges of the opening from moisture and electromagnetic radiation.

49. The radiation resistant joint as recited in claim 48 wherein said sealing means comprises an elongated metal plate, said metal plate being U-shaped in cross-section to define a pair of confronting plate portions one and the other plate portion engaging he flange plate and the frame member.

50. The radiation resistant joint as recited in claim 49 wherein said sealing means comprises a strip of polymer sandwiched between the plate portions.

51. In a doorway construction for a radio-frequency resistant enclosure of the type including a door frame defining a doorway, a door pivotally supported on said door frame and sized to closed said doorway, each said door and door frame having conductive edge portions and one having a channel cooperating to receive a conductive blade from the other one when the door is closed, and contact means in said channel for completing a conductive path between the edge portions and said blade, characterized in that said channel includes an end wall and a pair of stepped side walls, a first step on each side wall extending from the door frame to the interior of said channel and a second step on each side wall being offset from its first step whereby to define a chamber interiorly of the channel adjacent the end wall, and said contact means comprises a pair of contact members that extend the length of the channel for electrically interconnecting each step of each of the side walls, and the opposite sides of said blade when the blade is inserted therein.

52. The doorway construction as recited in claim 51 wherein the steps of each said side wall define a shoulder that generally faces said end wall, said contact members electrically contacting the shoulder and the end wall.

53. The doorway construction as recited in claim 51 wherein said side walls extend from the end wall and away from one another at an included acute angle.

* * * * *

UNITED STATES PATENT AND TRADEMARK OFFICE
CERTIFICATE OF CORRECTION

PATENT NO. : 4,817,337

DATED : April 4, 1989

INVENTOR(S) : Michael J. Lahita

It is certified that error appears in the above-identified patent and that said Letters Patent is hereby corrected as shown below:

Column 1, line 60, after "4" insert -- is --.

Column 2, line 23, after "beryllium" insert --  -  --.

Column 2, line 34, after "member" insert -- engages --.

Column 2, line 42, "xembers" should be -- members --.

Column 3, line 7, "tack" should be -- back --.

Column 3, line 8, "edge" should be -- wedge --.

Column 3, line 36, "xembers" should be -- members --.

Column 3, line 45, "xembers" should be -- members --.

Column 4, line 43, after "the" insert -- back wall --.

Column 4, line 45, "edge" should be -- wedge --.

Column 5, line 17, "towed" should be -- bowed --.

UNITED STATES PATENT AND TRADEMARK OFFICE
CERTIFICATE OF CORRECTION

PATENT NO. : 4,817,337

DATED : April 4, 1989

INVENTOR(S) : Michael J. Lahita

It is certified that error appears in the above-identified patent and that said Letters Patent is hereby corrected as shown below:

Column 5, line 34, "tack" should be -- back --.

Column 6, line 38, after "said" insert -- side --.

Column 6, line 67, after "edge" insert -- of --.

Column 7, line 3, after "channel" insert -- adjacent --.

Column 7, line 8, "comprise" should be -- comprises --.

Column 7, line 11, "nd" should be -- end --.

Column 7, line 13, "ne" should be -- one --.

Column 7, line 17, delete "de wall" and insert therefor -- side walls --.

Column 7, line 21, "he" should be -- the --.

Column 7, line 35, after "door" insert -- edge --.

Column 8, line 7, "xembers" should be -- members --.

Column 8, line 13, "engage" should be -- engaged --.

Column 8, line 25, "a large" should be -- enlarged --.

Column 8, line 30, after "walls" insert -- each --.

Column 9, line 4, "including" should be -- inclining --.

Column 9, line 54, after "laterally" insert -- separated --.

UNITED STATES PATENT AND TRADEMARK OFFICE
CERTIFICATE OF CORRECTION

PATENT NO. : 4,817,337

DATED : April 4, 1989

INVENTOR(S) : Michael J. Lahita

It is certified that error appears in the above-identified patent and that said Letters Patent is hereby corrected as shown below:

Column 10, line 6, "in" should be -- is --.

Column 10, line 9, "th®" should be -- the --.

Column 10, line 24, "he" should be -- the --.

Column 10, line 32, "closed" should be -- close --.

Column 10, line 37, after "edge" insert -- of --.

Signed and Sealed this

Fifth Day of December, 1989

Attest:

JEFFREY M. SAMUELS

Attesting Officer     Acting Commissioner of Patents and Trademarks